US010948516B2

(12) United States Patent
Karlgaard

(10) Patent No.: US 10,948,516 B2
(45) Date of Patent: Mar. 16, 2021

(54) METHODS AND SYSTEMS FOR CONNECTING AND METERING DISTRIBUTED ENERGY RESOURCE DEVICES

(71) Applicant: Landis+Gyr Innovations, Inc., Alpharetta, GA (US)

(72) Inventor: Matt Karlgaard, Brainerd, MN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 88 days.

(21) Appl. No.: 16/244,701

(22) Filed: Jan. 10, 2019

(65) Prior Publication Data

US 2020/0225263 A1 Jul. 16, 2020

(51) Int. Cl.
*G01R 1/04* (2006.01)
*G01R 11/04* (2006.01)
(Continued)

(52) U.S. Cl.
CPC ............ *G01R 1/0416* (2013.01); *G01R 11/04* (2013.01); *G01R 22/065* (2013.01); *H01R 9/2433* (2013.01)

(58) Field of Classification Search
CPC ... G01R 1/00; G01R 1/02; G01R 1/04; G01R 1/0408; G01R 1/0416; G01R 11/00;
(Continued)

(56) References Cited

U.S. PATENT DOCUMENTS 4,463,311 A 7/1984 Kobayashi
4,977,482 A 12/1990 Langdon et al.
(Continued)

FOREIGN PATENT DOCUMENTS

CN 1403825 3/2003
CN 201467023 5/2010
(Continued)

OTHER PUBLICATIONS

"Unpublished U.S. Appl. No. 16/428,118, filed May 31, 2019", In accordance with the Waiver of the Copy Requirements in 37 CFR 1.98 for Cited Pending U.S. Patent Applications, 1287 O.G. 163 (Oct. 19, 2004), unpublished US Patent Application is available in the IFW and, therefore, not provided.
(Continued)

*Primary Examiner* — Hoai-An D. Nguyen
(74) *Attorney, Agent, or Firm* — Kilpatrick Townsend & Stockton LLP

(57) ABSTRACT

An electric meter socket includes: a first plurality of connection points within the electric meter socket configured to form electrical connections to line voltage wirings of an electric distribution system; a second plurality of connection points within the electric meter socket configured to form electrical connections to output voltage wirings of a DER device; one or more connection points within the electric meter socket configured to form an electrical connection of neutral wires of the electric distribution system, the DER device, and a load; and a plurality of receptacles, each of the plurality of receptacles electrically connected to a corresponding connection point and configured to accept a mating connector of an electric meter.

3 Claims, 8 Drawing Sheets

(51) Int. Cl.
*G01R 22/06* (2006.01)
*H01R 9/24* (2006.01)

(58) Field of Classification Search
CPC ........ G01R 11/02; G01R 11/04; G01R 21/00;
G01R 21/06; G01R 22/00; G01R 22/06;
G01R 22/061; G01R 22/065; H01R 9/00;
H01R 9/22; H01R 9/24; H01R 9/2425;
H01R 9/2433
USPC ..... 324/76.11, 126, 142; 340/500, 540, 635,
340/637, 654, 656; 439/167, 517, 607.14,
439/620.01, 620.09, 620.1, 620.11,
439/620.21, 620.22, 620.23, 620.25;
705/400, 412
See application file for complete search history.

(56) References Cited

U.S. PATENT DOCUMENTS

| | | | |
|---|---|---|---|
| 5,572,396 A | 11/1996 | Robinson | |
| 6,188,145 B1 | 2/2001 | Stewart | |
| 6,420,801 B1 | 7/2002 | Seefeldt | |
| 7,274,305 B1 | 9/2007 | Luttrell | |
| 7,298,134 B2 | 11/2007 | Weikel et al. | |
| 7,648,389 B1 | 1/2010 | Scott et al. | |
| 8,784,130 B2 * | 7/2014 | Scott | H01R 33/945 |
| | | | 439/517 |
| 9,318,861 B2 | 4/2016 | Fulton et al. | |
| 9,391,414 B2 | 7/2016 | Seals | |
| 9,437,986 B2 | 9/2016 | Knauer et al. | |
| 9,484,653 B1 * | 11/2016 | Chen | H01R 12/7088 |
| 9,595,815 B2 | 3/2017 | Knauer et al. | |
| 9,620,305 B2 | 4/2017 | Miller et al. | |
| 9,627,861 B2 | 4/2017 | Cruz | |
| 9,995,768 B2 | 6/2018 | Parks et al. | |
| 10,132,838 B2 | 11/2018 | Parks et al. | |
| 2002/0075622 A1 | 6/2002 | Robinson | |
| 2003/0034693 A1 | 2/2003 | Wareham et al. | |
| 2004/0036362 A1 | 2/2004 | Beck et al. | |
| 2005/0027464 A1 | 2/2005 | Jonker et al. | |
| 2008/0091625 A1 | 4/2008 | Kremen | |
| 2009/0121705 A1 | 5/2009 | Rzehak | |
| 2010/0003848 A1 | 1/2010 | Scott et al. | |
| 2010/0105226 A1 * | 4/2010 | Gong | H01R 13/7031 |
| | | | 439/135 |
| 2010/0225305 A1 | 9/2010 | Reineccius | |
| 2010/0306027 A1 | 12/2010 | Haugh | |
| 2013/0106397 A1 | 5/2013 | Fulton et al. | |
| 2013/0123997 A1 | 5/2013 | King et al. | |
| 2013/0226485 A1 | 8/2013 | Pietrowicz et al. | |
| 2014/0218010 A1 | 8/2014 | Fulton et al. | |
| 2015/0233980 A1 | 8/2015 | Umetsu et al. | |
| 2015/0285844 A1 | 10/2015 | May | |
| 2015/0309075 A1 | 10/2015 | Parks et al. | |
| 2016/0061870 A1 | 3/2016 | Vaculik et al. | |
| 2016/0181752 A1 | 6/2016 | Parks et al. | |
| 2016/0320427 A1 | 11/2016 | Bautista et al. | |
| 2016/0380413 A1 | 12/2016 | Cruz | |
| 2017/0168516 A1 | 6/2017 | King | |
| 2017/0212160 A1 | 7/2017 | Fulton et al. | |
| 2017/0214225 A1 | 7/2017 | Ramachandran et al. | |
| 2017/0346296 A1 | 11/2017 | Schamber et al. | |
| 2018/0246150 A1 | 8/2018 | Cook | |

FOREIGN PATENT DOCUMENTS

| | | |
|---|---|---|
| CN | 201623651 | 11/2010 |
| CN | 101976854 | 2/2011 |
| CN | 103138291 | 6/2013 |
| CN | 103187735 | 7/2013 |
| CN | 105242087 | 1/2016 |
| JP | 2011204045 | 10/2011 |
| WO | 2003014748 | 2/2003 |
| WO | 2011124657 | 10/2011 |
| WO | 2017205724 | 11/2017 |

OTHER PUBLICATIONS

International Application No. PCT/US2017/034653, "International Search Report and Written Opinion", dated Aug. 10, 2017, 12 pages.
International Patent Application No. PCT/US2020/012485, International Search Report and Written Opinion, dated Apr. 12, 2020, 12 pages.

* cited by examiner

METHODS AND SYSTEMS FOR CONNECTING AND METERING DISTRIBUTED ENERGY RESOURCE DEVICES

BACKGROUND

Distributed Energy Resource (DER) devices, for example, solar panels, electric vehicle batteries, etc., are typically wired into the grid via a connection into a circuit breaker in an electrical panel within a customer's premises. If metering of the DER device is required, a separate meter is mounted on the customer's wall for this purpose. One or more disconnect switches are also mounted on the customer's wall.

In some installations, a collar is added between the meter socket and the meter. Included in this collar are circuit breakers and/or disconnect switches, and terminal block connections to connect a DER device to a meter to measure the energy flow to or from the DER device.

Currently there is no standard method to connect DER devices to the grid. Existing methods are often complicated and present an unaesthetic solution attached on the side of a wall, for example, at a customer's residence.

SUMMARY

Systems and methods for connecting and metering distributed energy resource devices are provided.

According to various aspects of the present disclosure there is provided an electric meter socket. In some aspects, the electric meter socket may include: a first plurality of connection points within the electric meter socket configured to form electrical connections to line voltage wiring of an electric distribution system; a second plurality of connection points within the electric meter socket configured to form electrical connections to output voltage wirings of a DER device; one or more third connection points within the electric meter socket configured to form an electrical connection of neutral wires of the electric distribution system, the DER device, and a load; and a plurality of receptacles, each of the plurality of receptacles electrically connected to a corresponding connection point and configured to accept a mating connector of an electric meter.

The electric meter socket may further include a third plurality of connection points within the electric meter socket configured to form electrical connections to the load. The neutral wire of the load may be connected to the one or more connection points within the electric meter socket forming an electrical connection with the neutral wires of the electric distribution system and the DER device.

Each of the first plurality of connection points within the electric meter socket may correspond to line voltage wirings of the electric distribution system with voltages having different electrical phases.

The electric meter socket may further include a controllable electrical disconnect switch configured to connect and disconnect the DER device from the electric distribution system based on power production and consumption requirements of the electric distribution system and the DER device. The controllable electrical disconnect switch may also be configured to connect and disconnect the DER device from the electric distribution system based on a command received from the electric meter.

The electric meter socket may further include a circuit breaker connected between the line voltage wiring of the DER device and the corresponding receptacles. The circuit breaker may be configured to disconnect the DER device from the electric distribution system on an occurrence of an electrical fault.

According to various aspects of the present disclosure there is provided an electric meter. In some aspects, the electric meter may include: a plurality of connectors configured to form electrical connections to corresponding receptacles in an electric meter socket, where at least one electrical connection to the plurality of receptacles may be formed with a neutral wire; and a plurality of measurement devices configured to measure electrical characteristics of voltage and current waveforms provided to the electric meter from an electric distribution system and a distributed energy resource (DER) device via the plurality of connectors.

The plurality of measurement devices may be configured to measure electrical characteristics of voltage and current waveforms provided to a load. The neutral wire may provide an electrical reference point for measurement of the voltage waveforms.

The plurality of measurement devices may include a plurality of voltage transformers. Each of the plurality of voltage transformers may be configured to individually measure voltage characteristics of one of a plurality of line voltages provided from the electric distribution system or output voltage provided by the DER device. Each of the plurality of line voltages provided from the electric distribution system may have a different electrical phase. Measurements of the voltage characteristics may be performed between line voltage wirings of the electric distribution system and the neutral wire.

The plurality of measurement devices may include a plurality of current transformers. The plurality of current transformers may be configured to individually measure current consumed by a load on each line voltage wiring connected to the load and current provided by the line voltage wirings of the electric distribution system and the output voltage wirings of the DER device.

According to various aspects of the present disclosure there is provided a system for connecting and metering distributed energy resource devices. In some aspects, the system may include: an electric meter; and an electric meter socket configured to accommodate the electric meter. The electric meter socket of the system may include a first plurality of connection points within the electric meter socket configured to form electrical connections to line voltage wiring of an electric distribution system; a second plurality of connection points within the electric meter socket configured to form electrical connections to line voltage wirings of a DER device; one or more third connection points within the electric meter socket configured to form an electrical connection of neutral wires of the electric distribution system, the DER device, and a load; and a plurality of receptacles, each of the plurality of receptacles electrically connected to a corresponding connection point and configured to accept a mating connector of an electric meter.

The electric meter socket of the system may further include a third plurality of connection points within the electric meter socket configured to form electrical connections to a load. The neutral wire of the load may be connected to the one or more connection points within the electric meter socket forming an electrical connection with the neutral wires of the electric distribution system and the DER device.

Each of the first plurality of connection points within the electric meter socket of the system may correspond to line voltage wirings of the electric distribution system with voltages having different electrical phases.

The electric meter socket of the system may further include a controllable electrical disconnect switch configured to connect and disconnect the DER device from the electric distribution system based on power production and consumption requirements of the electric distribution system and the DER device. This controllable electrical disconnect switch may also be a standalone device separate from the electric meter socket. The controllable electrical disconnect switch may also be configured to connect and disconnect the DER device from the electric distribution system based on a command received from the electric meter.

The electric meter socket of the system may further include a circuit breaker connected between the line voltage wirings of the DER device and the corresponding receptacles. The circuit breaker may be configured to disconnect the DER device from the electric distribution system on an occurrence of an electrical fault.

The electric meter of the system may include: a plurality of connectors configured to form electrical connections to corresponding receptacles in an electric meter socket, wherein at least one electrical connection to the receptacles may be formed with a neutral wire; and a plurality of measurement devices configured to measure electrical characteristics of voltage and current waveforms provided to the electric meter from the electric distribution system and a distributed energy resource (DER) device via the plurality of connectors.

The plurality of measurement devices may include measurement devices configured to measure electrical characteristics of voltage and current waveforms provided to a load. The neutral wires may provide an electrical reference point for measurement of the voltage waveforms.

The plurality of measurement devices may include a plurality of voltage transformers. Each of the plurality of voltage transformers may be configured to individually measure voltage characteristics of one of a plurality of line voltages provided from the electric distribution system or output voltage provided by the DER device. Each of a plurality of line voltages provided from the electric distribution system may have a different electrical phase. Measurements of the voltage characteristics may be performed between the line voltage wirings of the electric distribution system and the neutral wires.

The plurality of measurement devices may include a plurality of current transformers. The plurality of current transformers may be configured to individually measure current consumed by the load on each of the line voltage wirings connected to the load and current provided by the line voltage wirings of the electric distribution system and the DER device.

Numerous benefits are achieved by way of the various embodiments over conventional techniques. For example, the various embodiments provide a more aesthetically pleasing and simpler installation as compared to conventional meter installations. In some embodiments, integrating metering and processing into a single meter may form a basis for utilization of the meter as a home energy controller to manage all energy aspects of a residential home or commercial building. These and other embodiments along with many of its advantages and features are described in more detail in conjunction with the text below and attached figures.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Figure 1:
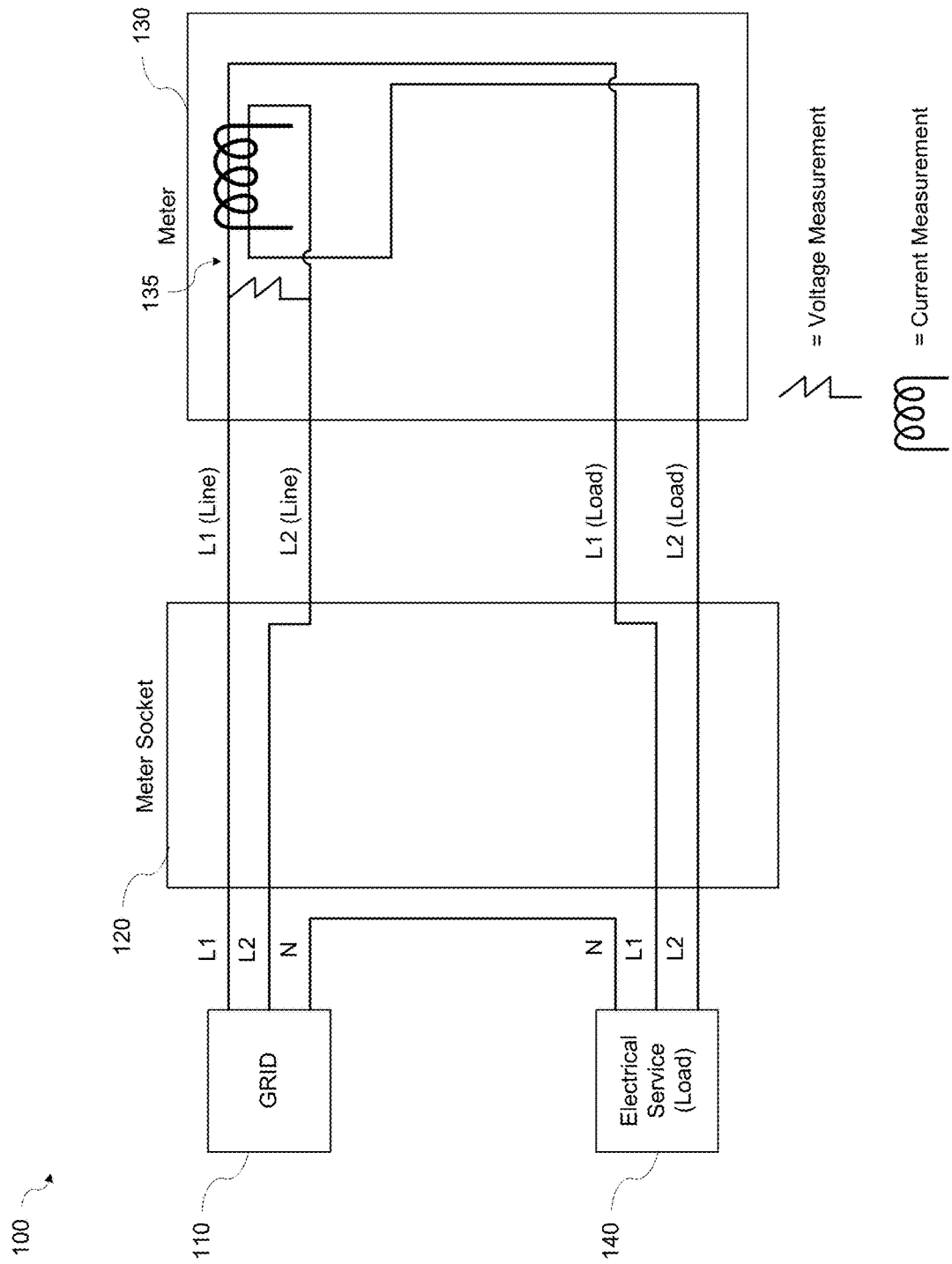
FIG. 1 is a block diagram illustrating electrical connections to a conventional meter and meter socket.

FIG. 1 is a block diagram 100 illustrating electrical connections to a conventional meter and meter socket. The meter and meter socket are located at the customer premises. The meter measures and controls the electricity delivered to the customer premises via the electric distribution system (i.e., the grid). The meter may be combined with a communications module to enable the meter to communicate with other meters and with the utility. As illustrated in FIG. 1, power from the grid 110 (i.e., the electric distribution system) is supplied to the meter socket 120 via electrical wiring L1 and L2. Electrical wiring L1 and L2 may provide power from two phases of the grid. The neutral wire N, sometimes referred to as ground, is connected between the grid 110 and the electrical service 140, for example, at an electrical service panel at a residential or commercial customer premises. The neutral wire N does not have a connection within the conventional meter socket.

The electrical service 140 is also connected to the meter socket 120 via corresponding electrical wiring L1 and L2. The meter socket 120 includes electrical connectors to provide electrical connections to the meter 130 when the meter 130 is plugged into the meter socket 120. An electrical connection between the grid 110 and the electrical service 140 is formed through the meter 130 when the meter 130 is plugged into the meter socket 120. Within the meter 130, voltage and current provided by the grid 110 to the electrical service 140 is measured, or metered, by measuring devices 135, for example, voltage transformers and current transformers. Power delivered to the electrical service 140 may be calculated based on the voltage and current measurements. The conventional meter socket 120 and meter 130 do not accommodate the additional connections required for a DER device.

Currently there is no standard method for connecting DER devices to the grid. Existing methods are often complicated and present an unaesthetic solution attached on the side of a wall, for example at a customer's residence. Many electricity markets require that power produced by DER devices be metered so that the utility can get credit for meeting an acceptable threshold of energy produced using renewable resources or for other reasons. A disconnect switch is required to disconnect the electrical power output of the DER device from the meter or meter socket to permit a technician to work on the electrical meter or meter socket. A circuit breaker is required in-line with the DER device to protect against surge and other events.

In addition to delivering power, the grid may also accept power generated by DER devices, collectively referred to herein as distributed generation devices, at customer premises. Various definitions of DER device have been used. For the purpose of this disclosure, a DER device is defined as any resource on the electric distribution system (i.e., the grid) that produces or stores electricity that can be sold back to the distribution system, or any large load device that can be controlled in order to manage overall peak load of the distribution system. The specific case of a DER device that is most prevalent is a residential solar installation, with or without local battery storage. The devices used to connect DER devices to the grid are separate and distinct from the utility meter located at the customer premises. They require additional installation and wiring and increase the complexity of the connections to the grid.

Various aspects of the present disclosure provide a simple, aesthetic method to connect a DER device to the electric distribution system via the meter socket and meter. Some aspects may include integration of the DER metering into the meter and/or the disconnect switch and circuit breaker into the meter socket. In accordance with various aspects of the present disclosure, methods of connecting a DER devices to a meter through a meter socket are provided.

An ANSI standard 2S form meter and meter socket are installed at most US residences. A 2S meter form has 4 connections, L1 and L2 from the line side (i.e., the electric distribution system), and L1 and L2 from the load side (i.e., the residential or commercial electrical service). In accordance with various aspects of the present disclosure, the mechanical form of any of ANSI standard 14S/15S/16S form meters may be repurposed (i.e., modified) to physically connect three additional connections from the DER device, i.e., L1, L2, and Neutral to enable connection of the DER device to the electric meter through the meter socket.

One of ordinary skill in the art will appreciate that while ANSI standard 14S/15S/16S and 5S form meters and meter sockets are mentioned, these are merely exemplary and other meter and meter socket forms may be used, modified, or created to perform the intended functions without departing from the scope of the present disclosure.

Figure 2A:
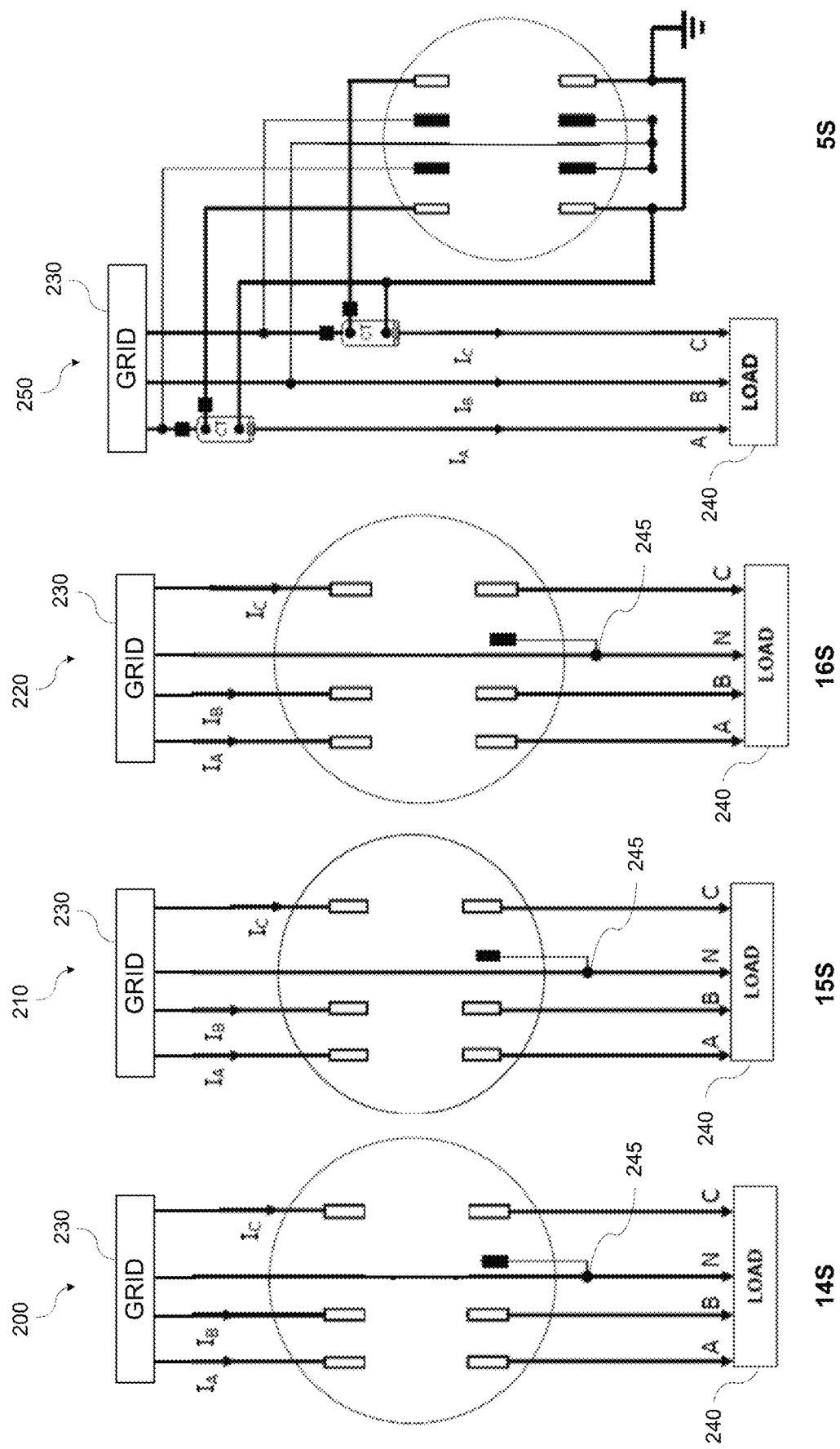
FIG. 2A is a diagram illustrating the ANSI standard 14S form meter socket, the 15S form meter socket, the 16S form meter and socket, the 5S form meter socket, and their standard connections.

FIG. 2A is a diagram illustrating the ANSI standard 14S form meter socket 200, the 15S form meter socket 210, the 16S form meter socket 220, the 5S form meter socket 250, and their standard connections. As illustrated in FIG. 2A, each of the 14S, 15S, and 16S meter forms provide six electrical connections between the grid 230 and the load 240 within the meter socket, while the 5S meter form provides eight electrical connections between the grid 230 and the load 240 within the meter socket. In each meter form, wiring for electrical phases A, B, and C provided from the grid 230 are connected within the meter socket; however, a connection 245 of the meter to the neutral wire N is formed outside of the meter socket.

Figure 2B:
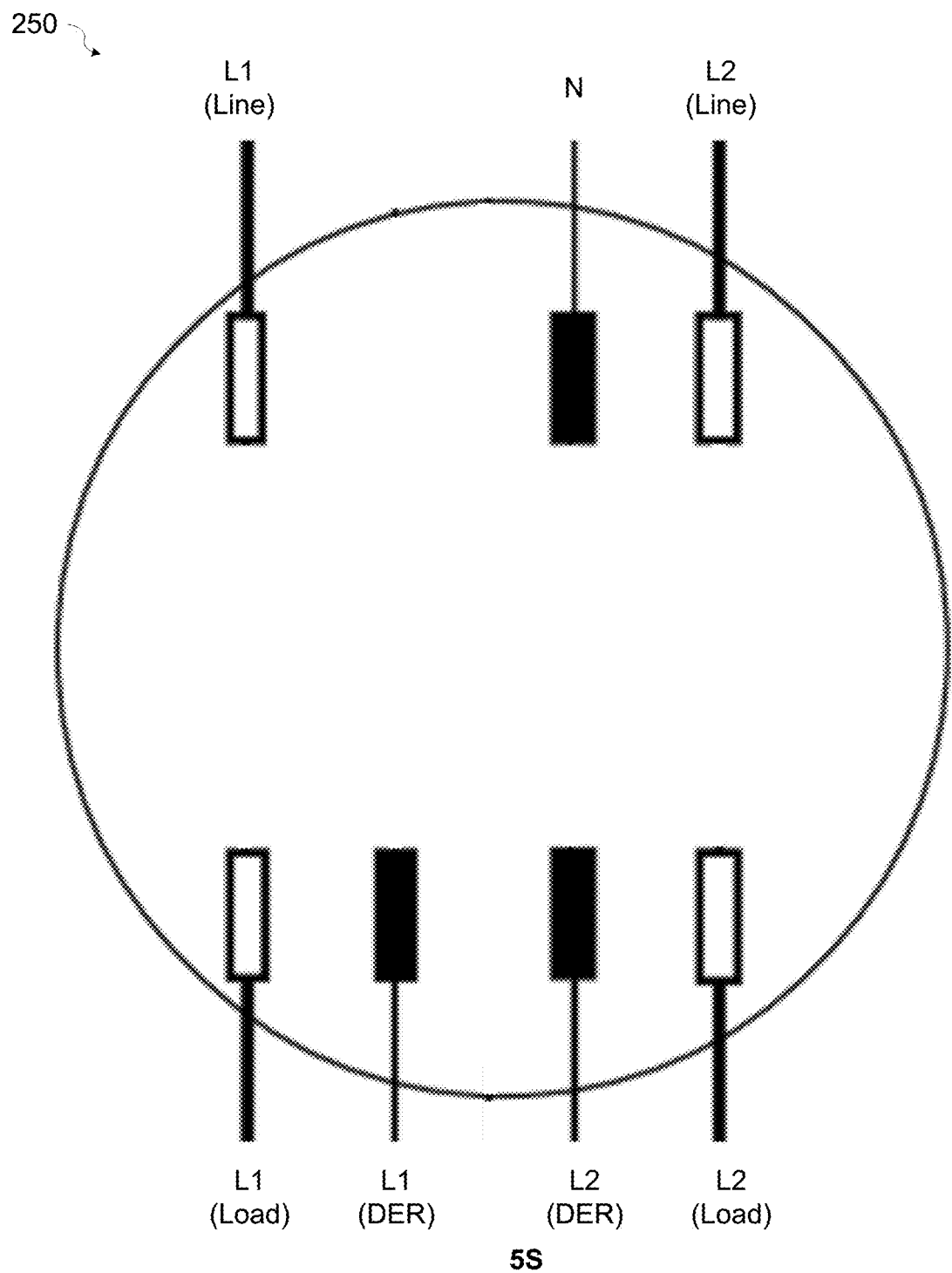
FIG. 2B is a diagram illustrating a modified ANSI standard 5S form meter socket with three additional lugs to add connectivity to a DER device according to various aspects of the present disclosure.

FIG. 2B is a diagram illustrating a modified ANSI standard 5S form meter socket with three additional lugs to add connectivity to a DER device according to various aspects of the present disclosure. As illustrated in FIG. 2B, the 5S form socket 250 provides seven connections: six electrical connections between the grid 230 and the load 240 within the meter socket that may be used to connect L1 and L2 line voltages (i.e., grid 310 voltages), and L1 and L2 DER output voltages, L1 and L2 load voltages, as well as a seventh connection from the neutral wire (N) to the meter socket.

Figure 3A:
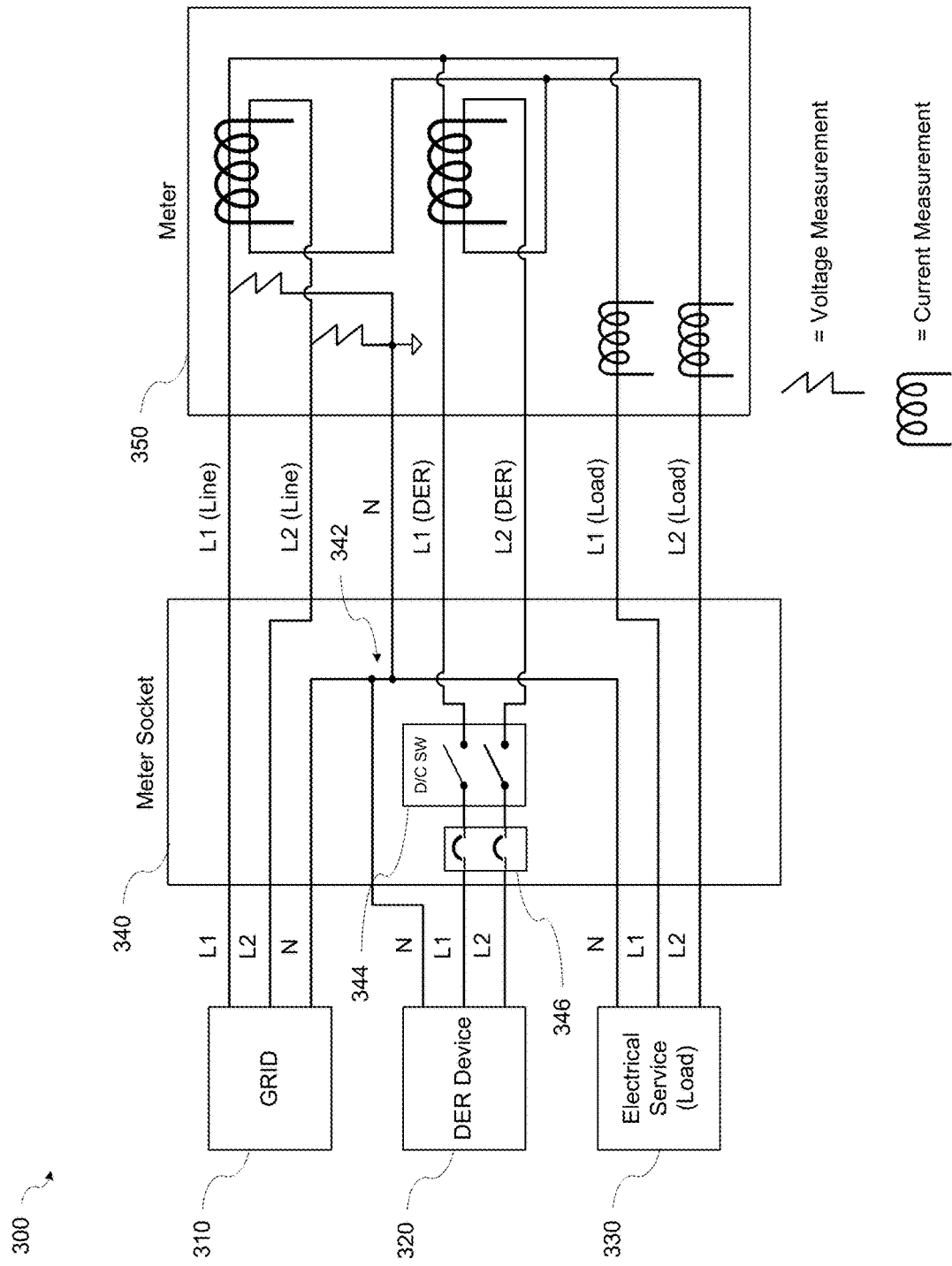
FIG. 3A is a schematic diagram of a meter and a meter socket according to various aspects of the present disclosure.

In accordance with various aspects of the present disclosure, the neutral wire connection may be formed within the meter socket. FIG. 3A is a schematic diagram 300 of a meter and a meter socket according to various aspects of the present disclosure. Referring to FIG. 3, wirings from the grid 310 (i.e., Line), the DER device 320, and the electrical service 330 may be connected into connection points within the meter socket 340. A neutral wire N connection 342 may be formed at a connection point within the meter socket 340 to connect the neutral wires from the grid 310, the DER device 320, and the electrical service 330.

The connection points may provide electrical connections to corresponding receptacles within the meter socket 340. For example, the connection points for the lines L1 and L2 from the grid 310 may be electrically connected to corresponding receptacles. The lines L1 and L2 from the grid 310 may provide voltages having different electrical phases. Similarly, the lines L1 and L2 from the DER device 320 and the lines L1 and L2 to the electrical service 330 may be electrically connected to corresponding receptacles. The lines L1 and L2 from the DER device 320 may provide voltages having different electrical phases. The connection point for the neutral wire N may also be electrically connected to a corresponding receptacle.

The receptacles included in the meter socket 340 may accommodate insertion of mating connectors, for example, but not limited to, blade connectors, on the first electric meter 350 to form electrical connections between the meter socket 340 and the first electric meter 350. As illustrated in FIG. 3A, when the connectors of the first electric meter 350 are inserted into the receptacles of the meter socket 340, electrical connections may be formed between the first electric meter 350 and the lines L1 and L2 from the grid 310, between the first electric meter 350 and the lines L1 and L2 from the DER device 320, and between the first electric meter 350 and the lines L1 and L2 to the electrical service 330.

In addition, when the connectors of the first electric meter 350 are inserted into the receptacles of the meter socket 340, an electrical connection may be formed between the neutral wire N in the meter socket 340 and the first electric meter 350. The electrical connection of the neutral wire N into the meter socket 340 and the first electric meter 350 may provide an electrical reference point to enable voltage measurements from L1 to neutral and L2 to neutral at the meter. The ability to perform these voltage measurements at the meter may allow for more advanced and higher fidelity metering than is possible with a standard 2S meter form, which only has L1 and L2 connections available (i.e., no neutral N connection) and therefore can only measure line to line voltage (i.e., from L1 to L2). The first electric meter 350 may be configured to perform current measurements on the L1 and L2 lines from the grid 310, the DER device 320 and the electrical service 330. The ability to perform L1 to neutral and L2 to neutral at the meter voltage measurements at the meter as well as the current measurements may enable implementation of various applications, for example, but not limited to, load disaggregation algorithms.

The L1 and L2 lines from the grid 310 may provide line voltages having different electrical phases. The different electrical phases be generated by a local distribution transformer (e.g., a pole-mounted transformer located near the meter) or may be different electrical phases generated at a substation. Similarly, the L1 and L2 lines from the DER device 320 may provide line voltages having different electrical phases. The electrical phases on the line voltage provided by the DER device may be synchronized with the electrical phases of the line voltages provided by the DER device. Embodiments of meter sockets and meters in accordance with the present disclosure may include more or less connection points and/or receptacles corresponding to different phases of line voltages. For example, when only one line voltage phase is connected (e.g., phase A) fewer connection points and receptacles may be included in the meter socket. Similarly, when three line voltage phases are connected (e.g., phases A, B, and C) additional connection points and receptacles may be included in the meter socket.

Figure 4:
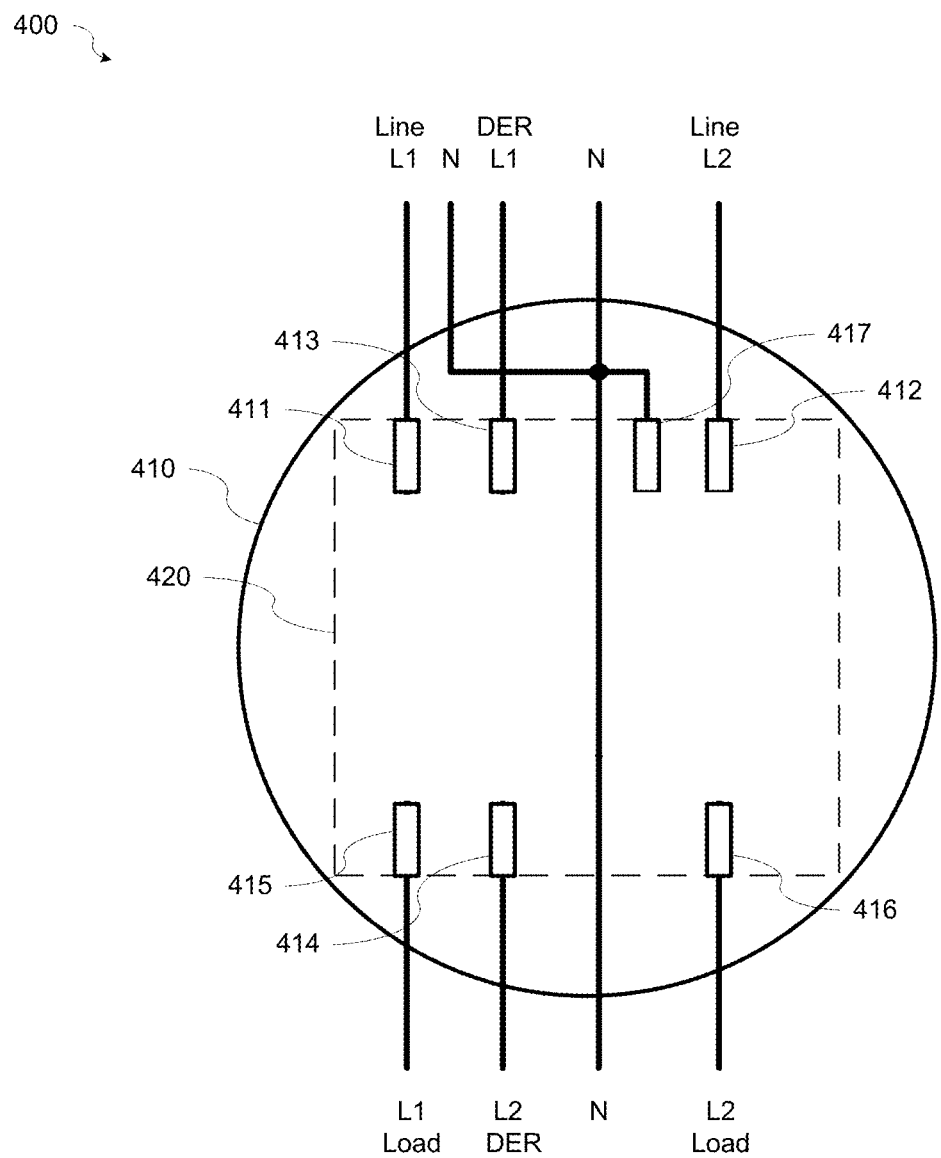
FIG. 4 is a diagram of the electrical connection in a meter socket according to various aspects of the present disclosure.

FIG. 4 is a diagram 400 of the electrical connections in a meter socket 410 in accordance with various aspects of the present disclosure. Referring to FIG. 4, the meter socket 410 may include a plurality of receptacles 411-417, for example, seven or another number of receptacles. The number of receptacles 411-417 the meter socket 410 may correspond to a number of mating connectors on the meter 420. In accordance with various aspects of the present disclosure, a meter socket 410 and meter 420 having seven or more receptacles/connectors may be suitable for implementing load disaggregation algorithms with an appropriate number of current transformers 421 (e.g., four or another number of current transformers) included in the meter 420.

As illustrated in FIG. 4, first and second receptacles 411, 412 may provide electrical connections to the meter 420 for line voltages L1 and L2 from the grid (e.g., the grid 310). Third and fourth receptacles 413, 414, may provide electrical connections to the meter 420 for line voltages L1 and L2 from the DER device (e.g., the DER device 320). Fifth and sixth receptacles 415, 416 may provide electrical connections to the electrical service (e.g., the electrical service 330) for line voltages L1 and L2 from the meter 420. The seventh receptacle 417 may provide an electrical connection from the neutral wire in the meter socket 410 to the meter 420. Providing a connection of the neutral wire into the meter 420 may enable the measurement devices (e.g., voltage transformers, current transformers, or other measurement devices) contained in the meter 420 to perform voltage measurements at the meter on the line voltages L1 and L2 from both the grid and the DER device in order to determine power provided or consumed by the grid and the DER.

Referring again to FIG. 3A, the meter socket 340 may include an integrated first controllable electrical disconnect switch 344 and/or a circuit breaker 346 that may be configured to disconnect and/or protect the DER device. For example, a single device may perform both functions or a circuit breaker and a separate service disconnect device to disconnect the L1 and L2 from the DER device. Alternatively, the electrical disconnect switch and/or the circuit breaker may be located external to the meter socket 340 while leaving the mechanical connections through the first electric meter 350 and meter socket 340 as described above.

The first controllable electrical disconnect switch 344 may include a processor (not shown) and a communications module (not shown). The first controllable electrical disconnect switch 344 may operate automatically to disconnect the DER device 320 from the grid 310, for example, when a high load is detected or when disconnected from the meter. In some embodiments, the first controllable electrical disconnect switch 344 may operate automatically to disconnect the DER device 320 from the grid 310 based on a command received from the first electric meter 350 or another device. The first controllable electrical disconnect switch 344 may enable connecting the DER device 320 to the first electric meter 350 to measure the DER device 320 power production/consumption as a separate value to the energy consumed from or sent back to the electric distribution system (i.e., the grid 310) thereby providing billable data. The billable data (consumption from the grid or production fed back to the grid) may be metered within the electricity meter using "net metering" or similar methods.

The first electric meter 350 may measure and control the electricity delivered to the electrical service 330 via the grid 310 and/or the DER device 320. The first electric meter 350 may include a communications module (not shown) and a processor (not shown). The processor may be a microprocessor; however, embodiments in accordance with the present disclosure are not limited to this implementation. For example, the processor may be a microprocessor, microcomputer, computer, microcontroller, programmable controller, or other programmable device. One of ordinary skill in the art will appreciate that other variations may be implemented without departing from the scope of the present disclosure.

The communications module may communicate via RF, cellular, PLC, or any other suitable communications technology. The communications module may receive communications via a network that include instructions for controlling the controllable electrical disconnect switch. The communications module may transmit information related to the operation of the meter and the measurements performed by the measurement devices in the meter to other devices on the network or a to central system.

Figure 3B:
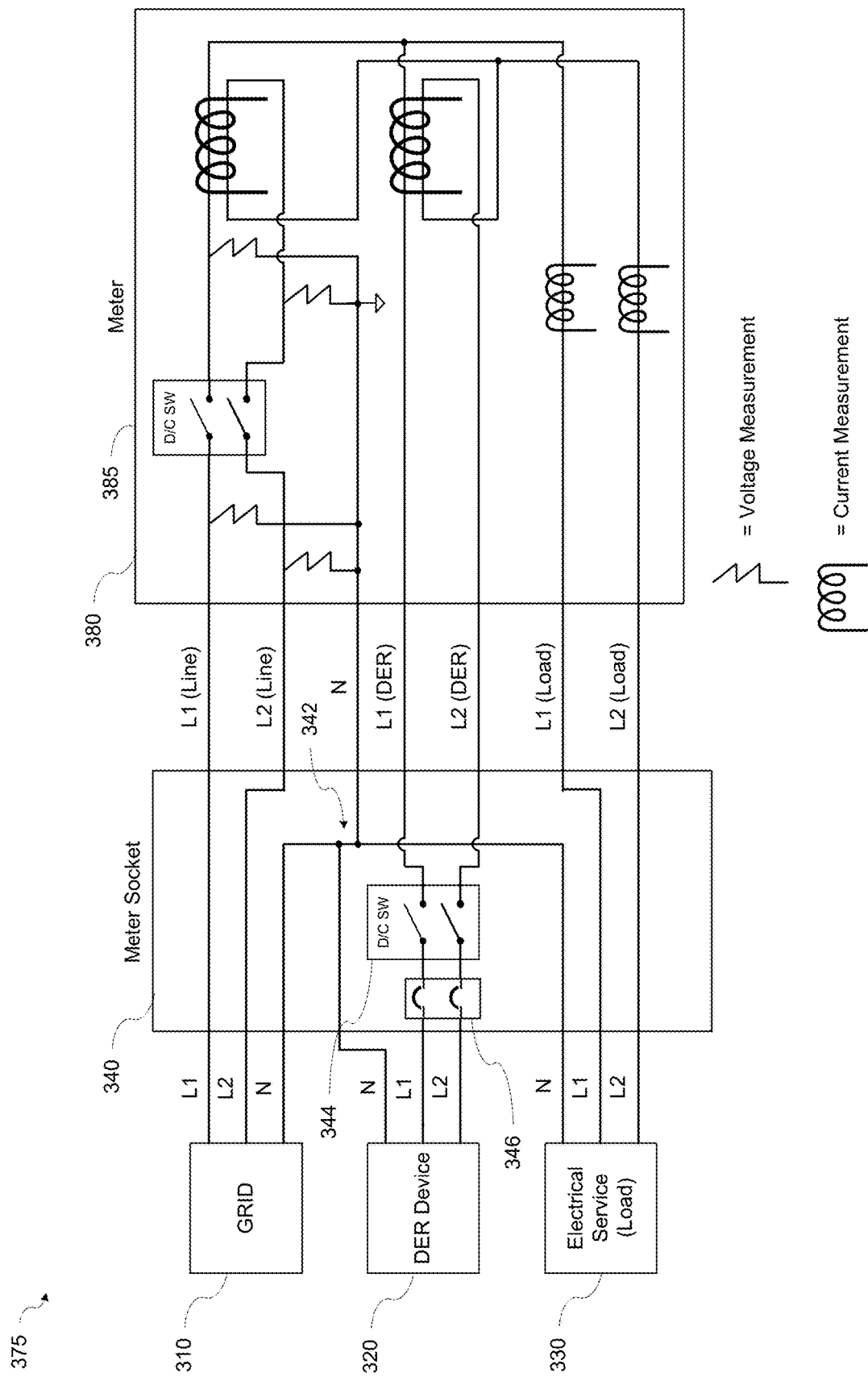
FIG. 3B is a schematic diagram of a meter and a meter socket illustrating another embodiment of an electric meter having a disconnect switch and additional measurement points according to various aspects of the present disclosure.

FIG. 3B is a schematic diagram 375 of a meter and a meter socket illustrating another embodiment of an electric meter 380 having a disconnect switch and additional measurement points according to various aspects of the present disclosure. Referring to FIG. 3B, the grid 310, DER device 320, electrical service 330, and meter socket 340 illustrate the same components that perform the same functions as the schematic diagram 300 of FIG. 3A and therefore will not be further described here. The second electric meter 380 may include the same components that perform the same measurement functions as the first electric meter 350 in FIG. 3A and therefore those components will not be further described here.

The second electric meter 380 may further include a second controllable electrical disconnect switch 385. The second controllable electrical disconnect switch 385 may be configured similarly to the first controllable electrical disconnect switch 344 to perform similar functions and therefore will not be further described here. The second controllable electrical disconnect switch 385 may be configured to disconnect the second electric meter 380 from the L1 and L2 connections to the grid 310. The ability to disconnect the second electric meter 380 from the grid 310 may enable "islanding," i.e., disconnecting from the grid 320 and supplying power only from the DER device 320. The second electric meter 380 may also provide voltage measurement capability from L1 to neutral and L2 to neutral on the grid 310 side of the second controllable electrical disconnect switch 385. The ability to measure L1 to neutral and L2 to neutral voltages on the grid 310 side of the second controllable electrical disconnect switch 385 may enable phase synchronization of the grid 310 voltages and the DER device voltages when the second electric meter 380 is reconnected to the grid 310.

While FIGS. 3A, 3B, and 4 illustrate a meter socket and meter having seven connections, embodiments in accordance with the present disclosure are not limited to this implementation. For example, some embodiments may include a different number of connections, for example, more or less than seven connections, without departing from the scope of the present disclosure.

In accordance with various aspects of the present disclosure, where the DER device consists of some form of electricity generator, for example, but not limited to, solar, wind, etc., and a storage device, the meter may use information about the electric distribution system. The information, may include, for example, but not limited to, real-time electricity pricing or other information, to make decisions and to control the DER system. For example, the meter may use information to determine whether the DER system/device should send energy to the grid (e.g., from solar or battery storage, where battery storage could include batteries within an electric vehicle or similar), whether the DER system/device should consume energy from the grid (e.g., to charge storage or allow large loads such as water heaters, pool pumps, etc., to run), and/or whether the DER system/device should disconnect from the grid, i.e., not consume energy from the grid or send energy to the grid. Appropriate control actions may be initiated by the meter based on the determination. One or ordinary skill in the art will appreciate that the above examples of decisions and control are not exhaustive and that other decisions and control operations may be performed without departing from the scope of the present disclosure.

In accordance with various aspects of the present disclosure, methods similar to those described above may be employed to add DER device switching and measurement capability to a meter socket having ANSI 15, 3S, 4S, 5S, and/or 12S, meter forms or other meter forms.

Figure 5A:
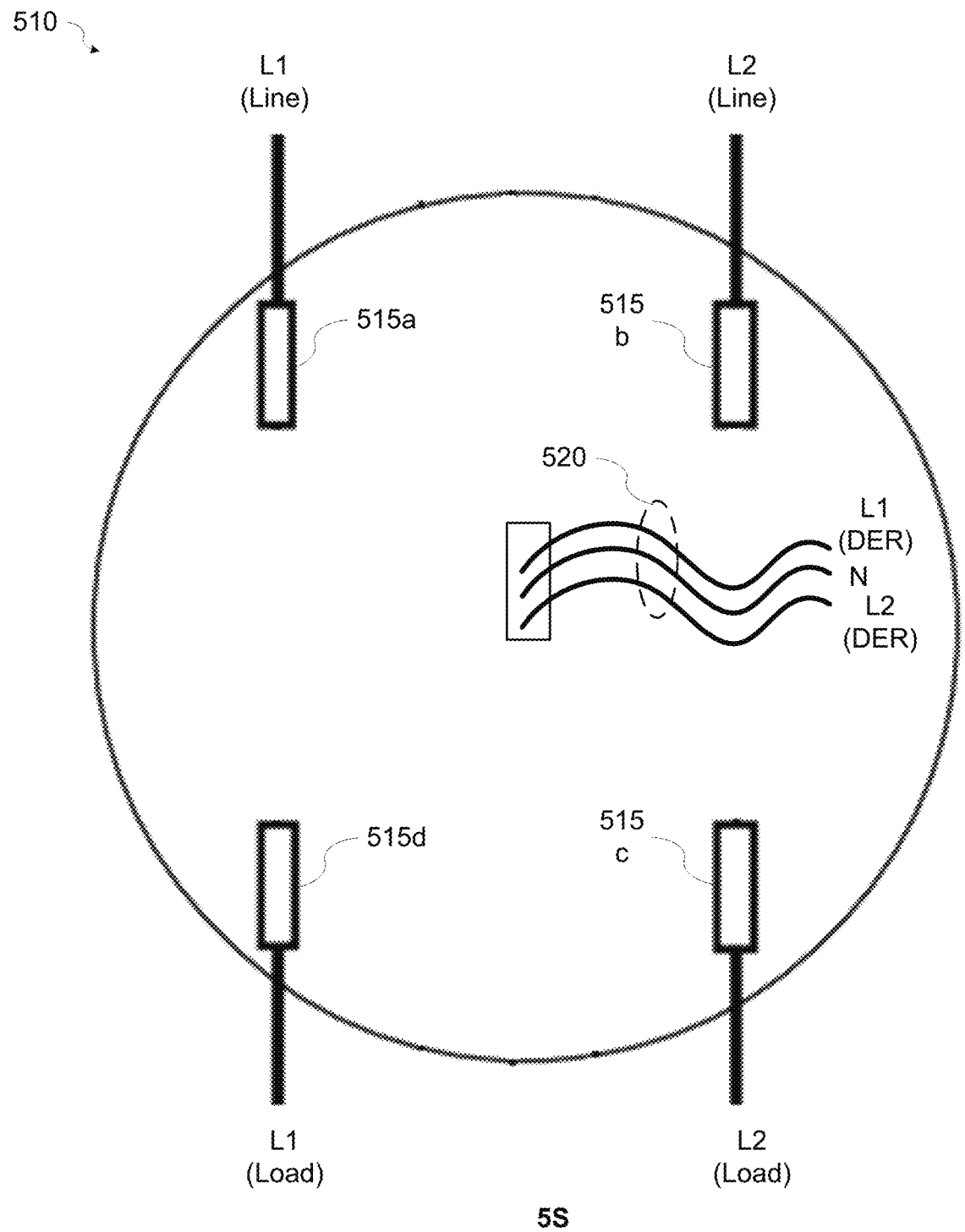
FIG. 5A is a diagram illustrating an ANSI standard 2S meter form according to various aspects of the present disclosure.

An ANSI standard 2S form meter socket and meter are installed at most US residences. FIG. 5A is a diagram illustrating an ANSI standard 2S meter form according to various aspects of the present disclosure. As illustrated in FIG. 5A, the 2S form socket 510 provides only four receptacles 515a-515d for electrical connections between the L1 and L2 line voltages (i.e., grid 310 voltages) and the L1 and L2 load voltages within the meter socket. In accordance with various aspects of the present disclosure, the 2S meter form may be modified for use with a modified electric meter to provide a connection to a DER device.

Figure 5B:
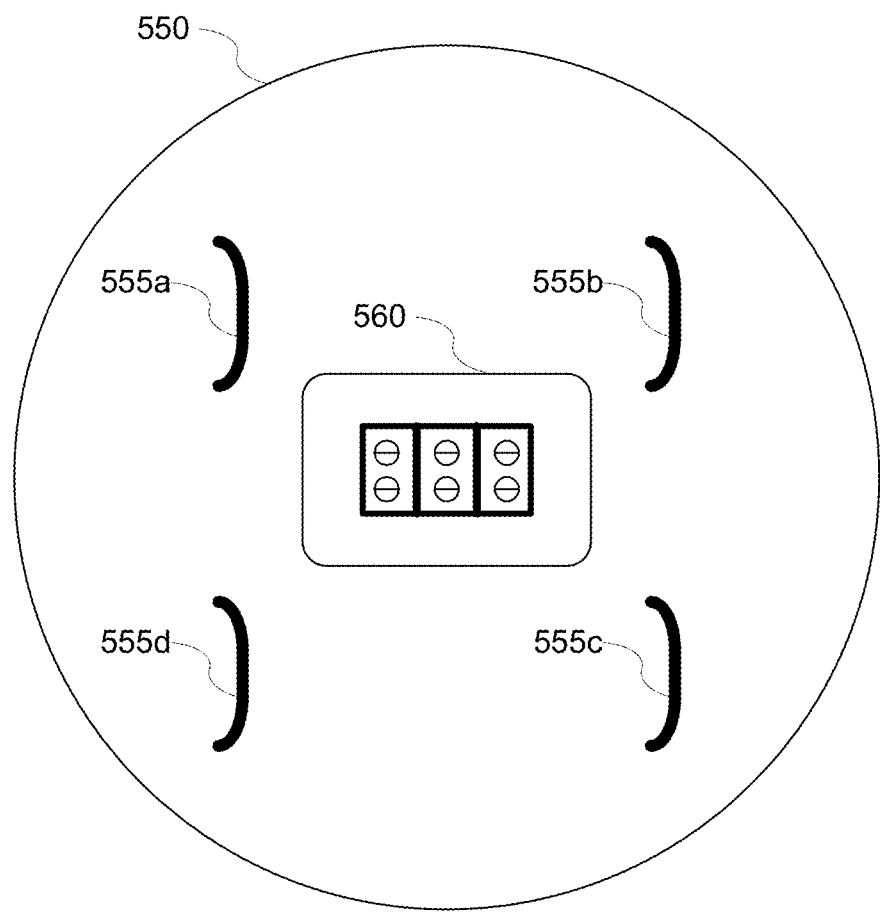
FIG. 5B is a diagram illustrating an embodiment of a third electric meter according to various aspects of the present disclosure.

Referring to FIG. 5A, the standard 2S form meter socket 510 may be modified to include a "pigtail" wiring harness 520 (i.e., separate wires not connected to the receptacles in the 2S socket) for connecting L1 and L2 voltages of a DER device as well as the neutral wire (N) to the electric meter. FIG. 5B is a diagram illustrating an embodiment of a third electric meter according to various aspects of the present disclosure. Referring to FIG. 5B, the third electric meter 550 may include four blade connectors 555a-55d. The four blade connectors 555a-55d on the third electric meter 550 may provide electrical connections to the four receptacles for the L1 and L2 line voltages and the L1 and L2 load voltages within the meter socket.

The third electric meter 550 may also include a terminal block 560, for example, but not limited to, a screw-type terminal block or another type of terminal block. The terminal block 560 may be configured to form a mechanical and electrical connection to L1 and L2 voltage wires of the DER device and the neutral wire contained in the pigtail wiring harness 520 of the modified 2S form meter socket 510.

In accordance with various aspects of the present disclosure, DER device metering may occur as a separate small form factor device external to the electric meter, either within the meter socket or external to the meter socket.

Embodiments in accordance with the present disclosure may provide numerous advantages over conventional techniques. Installation is simpler than alternative methods, for example, a neutral connection from the collar to the electrical panel is not required. The neutral connection is now one of the connections in the meter socket allowing the neutral wire to run with the rest of the wires in the conduit to the electrical panel. No power connections are made directly to a collar or meter so no conduit is required on top of the meter base. Thus, homeowners/solar installers/DER device installers can swap out their existing meter socket for the meter socket described herein that contains the additional connectors to connect the DER device. A meter according to the various embodiments may then be connected.

Embodiments in accordance with the present disclosure are more aesthetically pleasing than alternative installations since it has the same look and the same number of high level components at the meter as the non-DER solution. A second meter is not required and is not mounted on the customer's wall. Redundant components and circuitry are eliminated as compared with alternative installations. By integrating all metering and processing into a single meter, a second processor, power supply, and communications device can be eliminated, and cost to the customer may also be reduced.

In accordance with various aspects of the present disclosure, integrating metering and processing into a single meter may form a basis for utilization of the meter as a home energy controller to manage all energy aspects of a residential home or commercial building. For example, embodiments according to the present disclosure may be suitable for implementing load disaggregation algorithms for the electrical service.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. An electric meter socket, comprising:
   a first plurality of connection points within the electric meter socket configured to form electrical connections to line voltage wirings of an electric distribution system;
   a second plurality of connection points within the electric meter socket configured to form electrical connections to output voltage wirings of a distributed energy resource (DER) device;
   one or more third connection points within the electric meter socket configured to form an electrical connection of neutral wires of the electric distribution system, the DER device, and a load; and
   a plurality of receptacles, each of the plurality of receptacles electrically connected to a corresponding connection point and configured to accept a mating connector of an electric meter.

2. The electric meter socket of claim 1, further comprising:
   a third plurality of connection points within the electric meter socket configured to form electrical connections to the load,
   wherein a neutral wire of the load is connected to the one or more third connection points within the electric meter socket forming an electrical connection with the neutral wires of the electric distribution system and the DER device.

3. The electric meter socket of claim 1, wherein each of the first plurality of connection points within the electric meter socket corresponds to line voltage wirings of the electric distribution system with voltages having different electrical phases.

* * * * *